(12) United States Patent
Partridge et al.

(10) Patent No.: US 7,629,657 B2
(45) Date of Patent: Dec. 8, 2009

(54) EPISEAL PRESSURE SENSOR

(75) Inventors: Aaron Partridge, Palo Alto, CA (US); Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 92 days.

(21) Appl. No.: 11/064,658

(22) Filed: Feb. 23, 2005

(65) Prior Publication Data

US 2005/0142688 A1    Jun. 30, 2005

Related U.S. Application Data (62) Division of application No. 10/375,645, filed on Feb. 26, 2003, now Pat. No. 6,928,879.

(51) Int. Cl.
*H01L 29/84* (2006.01)
(52) U.S. Cl. .............................. 257/415; 257/E29.324; 438/53
(58) Field of Classification Search ............... 257/415, 257/E29.324; 438/53; 73/718, 724
See application file for complete search history.

(56) References Cited

U.S. PATENT DOCUMENTS

| | | | | |
|---|---|---|---|---|
| 4,744,863 A | * | 5/1988 | Guckel et al. .................. | 438/53 |
| 4,766,666 A | * | 8/1988 | Sugiyama et al. .......... | 29/621.1 |
| 4,849,071 A | * | 7/1989 | Evans et al. .................... | 438/53 |
| 4,945,769 A | * | 8/1990 | Sidner et al. ................... | 73/727 |
| 5,070,596 A | * | 12/1991 | Gaul et al. ..................... | 29/620 |
| 5,095,401 A | * | 3/1992 | Zavracky et al. ......... | 361/283.4 |
| 5,211,058 A | * | 5/1993 | Fukiura et al. ................. | 73/724 |

(Continued)

FOREIGN PATENT DOCUMENTS

WO    WO0202458 A1 *    1/2002

OTHER PUBLICATIONS

D.R. Bradbury, T.I. Kamins, C.W. Tsao, "Control of Lateral Epitaxial Chemical Vapor Deposition of Silicon Over Insulators," J. Appl. Phys. V. 44(2), pp. 519-523, 1984.

(Continued)

*Primary Examiner*—Steven J Fulk
(74) *Attorney, Agent, or Firm*—Kenyon & Kenyon LLP (57) ABSTRACT

A method for making a pressure sensor by providing a wafer including a base silicon layer, a buried sacrificial layer, and a top silicon layer. The top silicon layer is arranged over the buried sacrificial layer and the buried sacrificial layer is arranged over the base silicon layer. Etching vents through the top silicon layer to the buried sacrificial layer and removing a portion of the buried sacrificial layer. Depositing silicon to seal the vents and arranging a strain gauge or a capacitance contact on the wafer. A method for making a pressure sensor including providing a bulk wafer and depositing a sacrificial layer on the bulk wafer. Depositing silicon on the sacrificial layer and the bulk wafer to form an encapsulation layer. Etching vents through the encapsulation layer to the sacrificial layer and removing the sacrificial layer. Closing the vents with a silicon deposition and arranging a strain gauge or a capacitance contact on the encapsulation layer. A pressure sensing device including a substrate, an encapsulation layer with vents, and voids between the substrate and the encapsulation layer. A portion of the encapsulation layer above the voids forms a membrane and deposited silicon plugs fill the vents. A strain gauge or a top capacitive contact arranged on the membrane.

25 Claims, 8 Drawing Sheets

U.S. PATENT DOCUMENTS

| | | | |
|---|---|---|---|
| 5,242,863 A * | 9/1993 | Xiang-Zheng et al. | 438/53 |
| 5,357,807 A * | 10/1994 | Guckel et al. | 73/721 |
| 5,369,544 A * | 11/1994 | Mastrangelo | 361/283.4 |
| 5,427,975 A * | 6/1995 | Sparks et al. | 438/52 |
| 5,431,057 A * | 7/1995 | Zimmer et al. | 73/724 |
| 5,445,991 A * | 8/1995 | Lee | 216/2 |
| 5,470,797 A | 11/1995 | Mastrangelo | |
| 5,616,514 A * | 4/1997 | Muchow et al. | 438/50 |
| 5,985,688 A * | 11/1999 | Bruel | 438/53 |
| 6,521,508 B1 | 2/2003 | Cheong et al. | |
| 2002/0170875 A1 * | 11/2002 | Benzel et al. | 216/2 |
| 2004/0121506 A1 * | 6/2004 | Gogoi | 438/52 |

OTHER PUBLICATIONS

K.E. Violette, C.P. Chau, R., Wise, S. Unnikrishnan, "Facet-Free Selective Silicon Epitaxy by Reduce_Pressure Chemical Vapor Deposition," J. Electrochemical Soc., v. 146(5), pp. 1895-1902, 1999.

A. Partridge et al., "New Thin Film Epitaxial Polysilicon Encapsulation for Piezoresistive Accelerometers," Proc. MEMS-01 Interlaken, pp. 54-59, 2001.

* cited by examiner

EPISEAL PRESSURE SENSOR

CROSS-REFERENCE TO RELATED APPLICATION

This application is a division of prior application U.S. Ser. No. 10/375,645 filed Feb. 26, 2003 now U.S. Pat. No. 6,928,879.

FIELD OF THE INVENTION

The present invention generally regards episeal technology. More particularly, the present invention regards episeal pressure sensors in which an episeal membrane spans a cavity in a wafer.

BACKGROUND INFORMATION

Pressure sensors may be used in cars, for example, to measure oil pressure, to measure tire pressure, and to measure brake fluid pressure. Additionally, there are numerous non-automotive applications for pressure sensors.

Pressure sensors have been made using wafers by conventional micromachining methods. For example, pressure sensors have been built by thinning sensing membranes from the back of wafers. This method may be described as both reliable and mature, but the backside processing can be expensive and can consume large amounts of die area. The membrane may be formed by etching a wafer from the back until it is a predetermined distance from a front surface of the wafer and then stopping the etch. The distance from the front face may be tens of microns, and may be up to a hundred microns. Sensors, which are often piezoresistors, can be arranged in the top of the silicon that bridges the hole in order to measure the deflection of the silicon as a function of the pressure that is exerted across it. One problem with this technique is that cutting a hole from the back of the wafer can consume a lot of space on the die. An etching technique often used in this application is an anisotropic silicon etch, for instance a KOH etch, which generally does not cut completely vertical holes. The holes are usually pyramidal, and therefore require a die that is a few millimeters across on the bottom in order to make a hole that is a few hundred microns up to a half millimeter across on the top of the wafer. The larger die size increases the cost of the pressure sensor.

The strength of the membrane in terms of deflection may be approximately proportional to the cube of the thickness of the membrane. Therefore, a 10% error in the thickness may cause about a 30% error in the strength of the membrane, which may lead to about a 30% error in the sensitivity of the pressure sensing device using the membrane. In other words, a small error in the thickness may lead to a large error in the pressure measurement. The stiffness in terms of deflection is approximately proportional to the size (i.e. the lateral dimension) to the fourth power. The pyramidal pits caused by KOH etches have sloped edges in which the peak of the pyramid is at the back of the membrane. If the wafer varies in thickness, the size of the tip of the pyramid underneath the membrane can vary as well. Therefore, the size (i.e. the diameter) and the thickness of the membrane can be hard to control and may therefore impair the accuracy of the pressure sensor constructed in accordance with conventional methods.

Techniques have been developed for building pressure sensors entirely from the front of wafers by forming porous silicon areas on the top of the wafers, covering them with single crystal membranes of epitaxial silicon and melting away the buried porous silicon, thereby creating sealed evacuated cavities. Piezoresistors on the top of the silicon over these cavities sense the membrane's deflections. This technique may be limited, however, by crystal defects in the epitaxial silicon grown over the porous silicon.

SUMMARY OF THE INVENTION

A method for making a pressure sensor includes providing a wafer that has a base silicon layer, a buried sacrificial layer, and a top silicon layer. The top silicon layer is arranged over the buried sacrificial layer and the buried sacrificial layer is arranged over the base silicon layer. Vents are etched through the top silicon layer to the buried sacrificial layer and a portion of the buried sacrificial layer is removed. Silicon is epitaxially deposited to seal the vents and a strain gauge or a capacitance contact is arranged on the wafer.

A method for making a pressure sensor includes providing a bulk wafer and depositing a sacrificial layer on the bulk wafer. Silicon is deposited on the sacrificial layer and the bulk wafer to form an encapsulation layer. Vents are etched through the encapsulation layer to the sacrificial layer and the sacrificial layer is removed. The vents are closed with an epitaxial silicon deposition, and a strain gauge or a capacitance contact is arranged on the encapsulation layer.

A pressure sensing device includes a substrate, an encapsulation layer with vents, and voids between the substrate and the encapsulation layer. A portion of the encapsulation layer above the voids forms a membrane and epitaxially deposited silicon plugs the vents. A strain gauge or a top capacitive contact is arranged on the membrane.

The method of the present invention offers high quality single crystal silicon membranes for piezoresistor implants, and provides methods for building capacitive sensors. The finished membranes are pure silicon, without oxide plugs, and the technique avoids some problems that may occur with oxide-sealed membranes.

The cavity inside the silicon for the pressure sensor of the present invention may or may not open from the back. Cavities that open from the back allow differential pressure measurements, but may often be sealed off with a vacuum by bonding the wafer onto another wafer, for instance a glass wafer. One goal of the present invention is to make a cavity underneath the top of the wafer for use as a vacuum pressure reference.

The pressure may be measured by measuring the strain on a top membrane. Alternatively, the pressure may be measured by measuring the deflection of the top membrane by measuring the capacitance between the top membrane and the bottom of the cavity.

The technique involves making a membrane that is sealed. The sensor may be built on a small die because a pyramidal-shaped pit opposite the deformable membrane is not necessary. Therefore the cost of producing pressure sensors may be reduced. Additionally, a method according to an exemplary embodiment of the present invention may be very good at controlling the thickness and the size of the membrane of the pressure sensor, and may thereby produce a more accurate pressure sensor.

DETAILED DESCRIPTION

In an exemplary embodiment of the present invention, pressure sensor device structures are built with episeal technology. Episeal as used herein means sealing using an epitaxial reactor. An epitaxial reactor is used to deposit silicon epitaxially. Epitaxially deposited silicon follows the form of the silicon on which it is deposited, and may be either monocrystalline silicon or polycrystalline silicon. Epipoly is used herein to refer to epitaxially deposited polycycrystalline. Applications include both low cost and high accuracy pressure sensors. Sensing with both piezoresistive and capacitive techniques may be supported by the present invention. The pressure sensor according to an exemplary embodiment of the present invention may be built in at least two ways, either by growing epitaxial silicon or by using a bonded wafer, for instance an SOI (Silicon on Insulator) wafer. The proposed method may control the thickness by the epitaxial deposition parameters, or by bonding and grinding, and the method may control the diameter of the membrane by lithography. These processes are well-controlled.

Figure 1A:
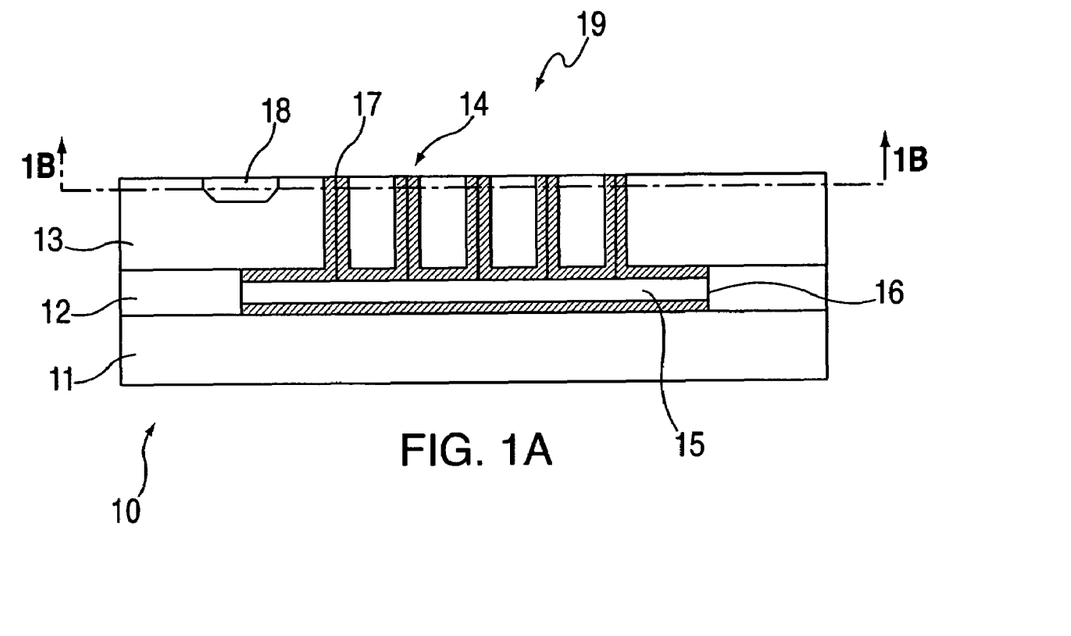
FIG. 1a is a schematic diagram showing a cross-sectional view of a pressure sensor according to an exemplary embodiment of the present invention utilizing conformal, selective epitaxial growth on an SOI wafer and using a strain gauge.
Figure 1B:
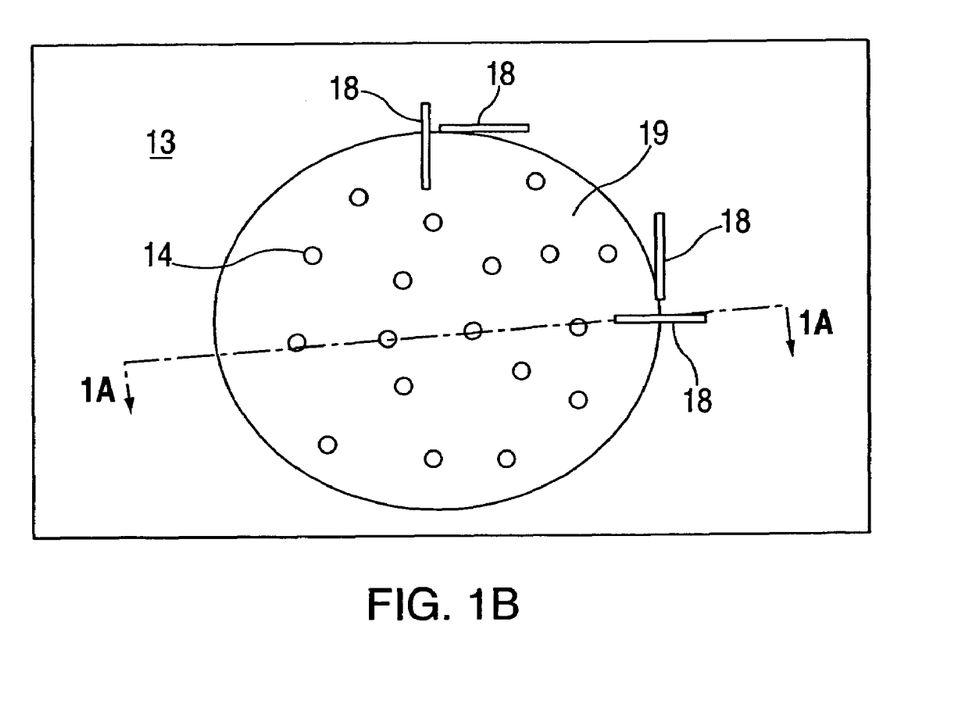
FIG. 1b is a top cross-sectional view of the exemplary embodiment shown in FIG. 1a, cut along line IB.
Figure 2:
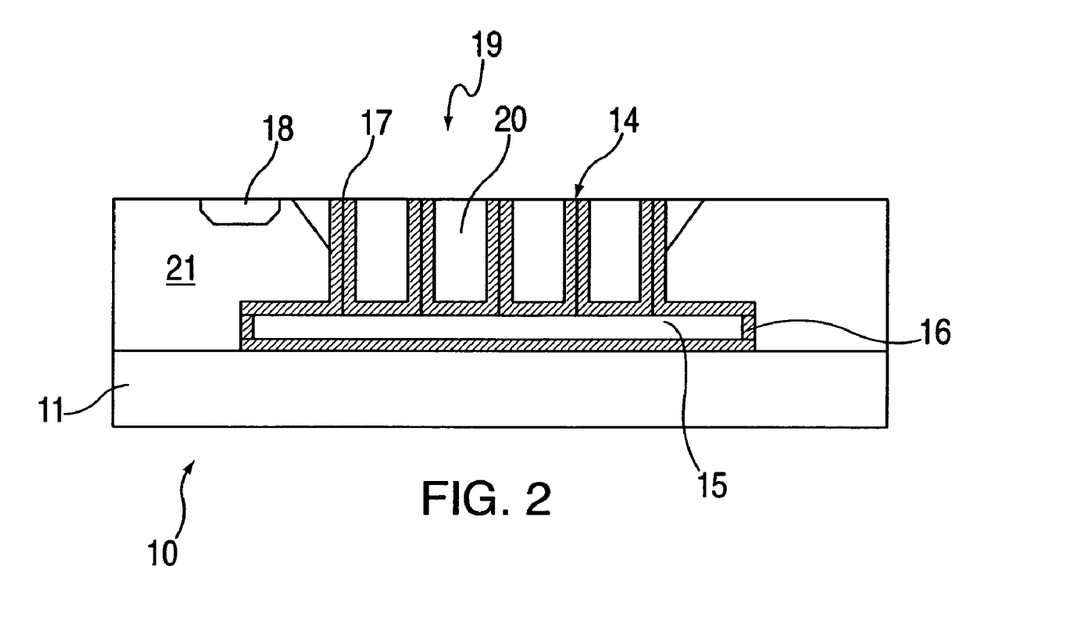
FIG. 2 is a schematic diagram showing a cross-sectional view of a pressure sensor according to an exemplary embodiment of the present invention utilizing conformal, non-selective epitaxial growth on a silicon wafer and using a strain gauge.

FIGS. 1a, 1b and 2 show sensors including piezoresistive elements. FIG. 1a shows a cross-sectional view of pressure sensor 10 which includes an SOI wafer including a base silicon layer 11 with a sacrificial layer 12 arranged on a top side of the silicon layer and which may be an oxide. On top of sacrificial layer 12 is top silicon layer 13.

The exemplary embodiment shown in FIG. 1a may involve starting with a bonded wafer. The bonded wafer may have base silicon layer 11, then sacrificial layer 12, and then top silicon layer 13. The thickness of top silicon layer 13 and the thickness of sacrificial layer 12 may be specified when the bonded wafer is purchased and/or created. This may be an SOI wafer which may be a precursor to the episeal pressure sensor. Sacrificial layer 12 may be about one or two microns thick and top silicon layer 13 may be about 2-10 microns thick. Base silicon layer 11 may have a wafer thickness of between about five and six hundred microns.

Vent holes 14 may be etched down through top silicon layer 13 to sacrificial layer 12. Vent holes 14 are shown as vertical slots. Vent holes 14 may be one or more round holes or may be oval-shaped holes, elongated slots, rounded rectangular slots, or other shapes as needed. The intermediate stage-product may be etched, for instance by exposure to HF acid vapor, to remove a portion of sacrificial layer 12 around the base of vent holes 14. The etching may proceed laterally into sacrificial layer 12 at a controlled rate, thereby creating cavity 15 of a known size by stopping the etch after a predetermined amount of time. This is due to the predictable etching rate used in the process. This intermediate stage product may then be placed in an epitaxial reactor and silicon grown epitaxially on the intermediate stage product.

Epitaxial silicon layer 17 may grow as a single crystal on the sidewalls of vent holes 14 and pinch off vent holes 14 (i.e. growing from the wall to the center and then pinching off vent holes 14). This process may leave gaps at the bottoms of these chimneys and pinch off near the top or seal at the bottom at about the same time as the top, depending on the degree of conformity of the epitaxial reaction. Additionally, vent holes 14 may be tapered so that they are wider at the top and narrower at the bottom (not shown). This may allow vent holes 14 to pinch off at the bottom first and then close upwards like a zipper, pinching off from the bottom up. In this manner, epitaxial silicon layer 17 may continue to grow after the bottom pinches off until the top is filled up. The tapering may be subtle (e.g. a 10 to 20% taper) to achieve a clean pinch off and/or closure of vent holes 14.

The epitaxial reactor may be adjusted in pressure, temperature, and chemical composition and may thereby be adjusted to deposit epitaxial silicon either conformally or non-conformally, and either selectively or non-selectively. Epitaxial silicon may be deposited by placing a wafer in a reactor and flowing a silicon-containing gas or gases over the wafer. The reactor may be adjusted, for instance by the inclusion of other gases (e.g. hydrochloric acid), so that silicon does not deposit on oxide. In this situation, the silicon reacts only when it contacts silicon, a process called selective epitaxial deposition. In selective epitaxial deposition, the silicon will only deposit on a silicon surface, therefore edge 16 of cavity 15 shown in FIG. 1a does not have epitaxial silicon deposited on it. Under selective epitaxial conditions, epitaxial silicon grows only on the bottom of cavity 15, on the top, in vent holes 14, and on the top surface of top silicon layer 13. However, the epitaxial silicon is not shown on the top surface of top silicon layer 13 in FIG. 1a because in a subsequent process step the top is polished to remove the epitaxial silicon and smooth the surface. Alternatively, the reactor may be adjusted to deposit silicon on all exposed surfaces (e.g. both silicon and oxide), which is called non-selective epitaxial deposition. Therefore, the epitaxial reactor may be controlled to deposit silicon only on silicon (selective deposition) or on both silicon and oxide (non-selective deposition).

Epitaxial silicon may also be deposited either conformally or non-conformally. In conformal deposition, the deposited silicon conforms to the shape of the etches. Conformally deposited silicon follows the contours of the object in the reactor, and may be either selective or non-selective. Highly conformal deposition has a uniform thickness everywhere it grows. In the structure illustrated in FIG. 1a, the thickness of sacrificial layer 12 may have to be thicker than two times the thickness of epitaxial silicon layer 17 in order to avoid filling cavity 15. The conformally deposited epitaxial silicon layer 17 is shown in FIG. 1a growing uniformly from the top and bottom of cavity 15 (but not growing on edge 16 representing the oxide sidewalls of cavity 15 and thereby indicating that the highly conformal epitaxial growth is also selective). Therefore, the thickness of sacrificial layer 12 may need to be greater than the diameter of vent holes 14 in this exemplary embodiment.

Alternatively, non-conformal deposition can cause more silicon to be deposited towards the opening of vent holes 14 (and on top silicon layer 13) than is deposited at the bottom of vent holes 14 and in cavity 15. However, non-conformal deposition tends to make vent holes 14 pinch off at the top which may cause membrane 19 to be weaker. For instance, if the reactants diffusing down into the structure react completely or nearly completely so that little or none of the unreacted reactants reach the bottom, there will be growth in vent holes 14 and on the top surface, but little or no growth at the bottom in cavity 15. Non-conformal epitaxial deposition may also be selective or non-selective.

The chemistry can be sensitive so that if one of the parameters is changed, all of the results may change. The epitaxial silicon growth is induced and modified by adjusting the deposition parameters, for instance the temperature, the pressure, the flow rates, and the materials used in the epitaxial reactor. The parameters may be tuned to get either conformal or non-conformal and either selective or non-selective epitaxial silicon growth.

In one exemplary embodiment, non-conformal epitaxial silicon growth may be used when large vent holes 14 are etched and a very thin sacrificial layer 12 is underneath so that cavity 15 would remain open when vent holes 14 pinch off. In another exemplary embodiment, conformal epitaxial silicon growth may be used when small vent holes 14 are etched and a thick sacrificial layer 12 is underneath so that vent holes 14 may close uniformly all the way up. Not shown in FIG. 1a is that the epitaxial silicon may also grow on the top of silicon layer 13 and may then be polished off. Polishing can be performed in order to smooth the top surface of silicon layer 13 and remove any dimples that may form in or around vent holes 14. Additionally, polishing may be performed in order to expose the original type of surface (e.g. p-type or n-type) of silicon layer 13. FIG. 1a shows piezoresistor 18, which is p-type, silicon layer 13, which is n-type. Alternatively, piezoresistor 18 may be an n-type piezoresistor and silicon layer 13 may be p-type.

FIG. 1a shows a cross sectional view showing a few of vent holes 14 that go through to sacrificial layer 12. The pattern of vent holes 14 as viewed from the top may be a circular pattern with a grid of these vent holes 14 or could it be any basic shape, for example an array, as shown in FIG. 1b. In one exemplary embodiment, vent holes 14 are slots rather than circular holes (see, for example, FIG. 3b). The slotted vent holes 14 may be, for example, four times as long as wide. In a further exemplary embodiment, slotted vent holes 14 may be arranged oriented in different directions to avoid making the silicon stiff in one direction and weak in a perpendicular direction. In one exemplary embodiment, the vent holes 14 may be arranged in a basket weave pattern, in which each slot is arranged orthogonal to each adjacent slot (see, for example, FIG. 3b). In one exemplary embodiment vent holes 14 may be arranged in a square array. In alternative exemplary embodiments vent holes 14 may be arranged in a round array or a hexagonal array.

In the exemplary embodiment of the present invention shown in FIG. 1b, four piezoresistors 18 may be used. The orientation of piezoresistors 18 with respect to the strain being measured influences the measurements. FIG. 1b shows two piezoresistors 18 arranged parallel to the strain and two piezoresistors 18 arranged perpendicular to the strain, for instance at 12 o'clock and 3 o'clock on circular membrane 19, within top silicon layer 13. One piezoresistor 18 is arranged parallel to the strain at the 12 o'clock position and one piezoresistor 18 is arranged perpendicular to the strain at the 12 o'clock position. Additionally, one piezoresistor 18 is arranged parallel to the strain at the 3 o'clock position and one piezoresistor 18 is arranged perpendicular to the strain at the 3 o'clock position. The strain fields around the cavity under membrane 19 are approximately perpendicular to the edge for a circular membrane 19, and therefore, if piezoresistors 18 are aligned parallel with the strain, then as the strain increases, their resistance increases. Alternatively, if piezoresistors 18 are aligned perpendicular to the strain, then as the strain increases, their resistance decreases. The two pairs of piezoresistors 18 may be balanced in the form of bridge circuit to reduce temperature effects. Alternative positions for piezoresistors 18 are also possible.

FIG. 1a shows a piezoresistive sensor built on an SOI wafer. Standard SOI wafers may be patterned, etched, sealed, and polished to form a buried cavity. The polishing step may be omitted. Piezoresistors 18 may then be formed along the edges of membrane 19 and circuitry may be built on this wafer with standard processes.

Benefits of this approach may be that the vents can be arranged so that the piezoresistors are fabricated in clear, low-defect silicon. The dimensions of membrane 19, and hence the device sensitivities, may be well-controlled. The beginning SOI's top silicon thickness in part determines the thickness of membrane 19.

FIG. 2 shows episeal pressure sensor 10 that may be constructed on bulk silicon by forming sacrificial oxide areas (not shown) to define the buried cavities. This exemplary embodiment involves starting with a wafer, then growing and patterning an island of oxide on the wafer, and then growing silicon on the wafer epitaxially to make membrane 19. Growing epitaxial silicon on top of monycrystalline silicon generally grows monocrystalline silicon, whereas growing epitaxial silicon on top of oxide grows polysilicon. It may be important in this case to control the epitaxial growth to form single-crystal overgrowth into which the piezoresistors will be built. The benefits of this approach may include cost savings from using inexpensive bulk wafers rather than SOI wafers. Additionally, enhanced dimensional control of the membranes may be possible using this method. The thickness of the membranes can be controlled solely by epitaxy and polish steps, while the extent of the membranes can be controlled by lithography and oxide etch steps, all of which may be well-controlled.

In the technique shown in FIG. 2, oxide is grown or deposited on the surface of base silicon layer 11 and is patterned to form an oxide island. The oxide island may typically be circular, be on the order of a micron thick, and may have a diameter on the order of 50 Φm-20 Φm. Next, silicon may be epitaxially deposited on top of the oxide island and on top of the exposed silicon wafer. Epitaxial single crystalline silicon can be deposited on the single crystal silicon, while epitaxial polycrystalline silicon can be deposited on the oxide. Subsequently, the oxide layer is etched away.

In FIG. 2, single crystal epilayer 21 wraps up around the edge of cavity 15. As noted above, cavity 15 may be defined by the oxide layer that is etched away in the process. Polycrystalline layer 20 in FIG. 2 does not start directly at the corner of the oxide (the top of edge 16 of cavity 15) but instead forms towards the center of the oxide island. This depositional characteristic may be influenced by adjusting the parameters of the epitaxial reactor. The single-crystal epilayer 21 may grow up laterally over the top of the edge of the oxide island (not shown, but the removal of the oxide island forms cavity 15). In this manner, piezoresistors 18 may be arranged on single-crystal epilayer 21. Alternatively, polycrystalline layer 20 may start forming wherever there is oxide.

The thickness of membrane 19 produced by the method of the exemplary embodiment of the present invention may be varied by varying the parameters of the epitaxial reactor and by varying the process times. Membrane 19 may be, for instance, a few microns thick, for example ten microns. The size of membrane 19 may depend on the pressure ranges which may be measured. High pressure measurements can be measured with smaller membrane 19 whereas low pressure measurements can be measured with larger membrane 19. Membrane 19 may be on the order of 50-200 Φm in diameter.

In one exemplary embodiment, membrane 19 may be thin and small in order to save space on the die. Alternatively, membrane 19 may be thicker and larger and may still have the same amount of deflection for a given pressure. Design considerations may determine the size and thickness of membrane 19. It may be possible to control the thickness of the epipoly with a high degree of accuracy and predictability. In alternative embodiments, in which the thickness of the epipoly may not be easily controlled, membrane 19 may be thicker so that variations in the thickness of membrane 19 would not have a great effect on the pressure measurements. For instance, in a ten micron thick membrane, plus or minus one micron is a ten percent error, which may result in about a thirty three percent pressure sensing error. However, if membrane 19 is forty microns thick, then one micron more or less is an error of two and a half percent, giving about an eight percent sensing error. The error budget analysis may determine the size/shape/thickness of membrane 19.

In an exemplary embodiment of the method according to the present invention to produce pressure sensor 10, the oxide may be grown or deposited evenly over the whole surface of base silicon layer 19. Then the oxide may be patterned and etched away. Then silicon may be applied epitaxially to form monocrystalline epilayer 21 and polycrystalline layer 20. Then vent holes 14 may be etched through polycrystalline layer 20 and possibly parts of monocrystalline epilayer 21 and the oxide remaining on base silicon layer 11 may be etched away. Then another epitaxial layer 17 may be deposited to pinch off vent holes 14. Then the surface may be polished to make the surface flat.

Epipoly techniques using silicon wafers rather than SOI wafers may be used because SOI wafers may be expensive. Epipoly techniques may allow the dimensions of cavity 15 to be defined when the oxide is etched, thereby defining cavity 15 lithographically. In contrast, the dimensions of cavity 15 produced from an SOI wafer may be defined by the amount of time that the oxide layer is etched. It may be more accurate to control the dimension of the cavity by lithographic techniques.

An alternative to measuring pressure using piezoresistive strain sensors on membrane 19 is to measure the deflection by measuring the capacitance between membrane 19 and the bottom of cavity 15. FIGS. 3a, 3b, 4a, and 4b show pressure sensors 10 including capacitive elements. As membrane 19 deflects down, increased capacitance may be measured. Measuring the capacitance requires electrically isolating membrane 19 from the bottom of cavity 15 and generally the rest of pressure sensor 10. In FIG. 2, the silicon is continuous between base silicon layer 11 and the surface of polycrystalline layer 20 and so the bottom of cavity 15 and polycrystalline layer 20 are electrically connected. The capacitance may not be measured because the bottom and the top are shorted out.

Figure 3A:
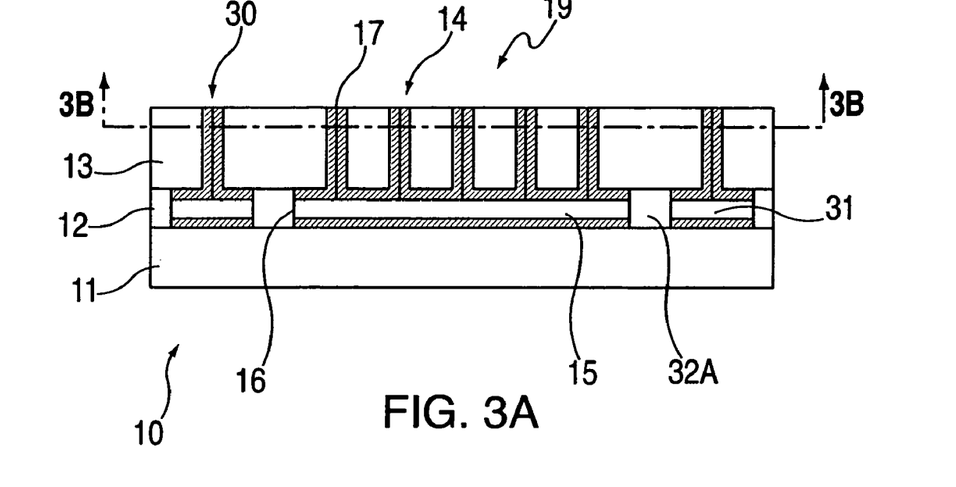
FIG. 3a is a schematic diagram showing a cross-sectional view of a pressure sensor according to an exemplary embodiment of the present invention utilizing conformal, selective epitaxial growth on an SOI wafer and using a capacitance sensor.

FIG. 3a shows a junction isolated capacitive sensor 10 built on an SOI wafer. In this exemplary embodiment, membrane 19 may be built on SOI wafers and may be surrounded with isolation ring 30, which may extend down to sacrificial layer 12. FIG. 3a shows isolation ring 30, which is a slot that cuts all the way around the pressure sensor membrane and to sacrificial layer 12, and which separates membrane 19 physically from top silicon layer 13 (also known as the field silicon layer). Membrane 19 may be supported on oxide support ring 32A. Capacitive episeal pressure sensor 10 of FIG. 3a may be mechanically similar to the piezoresistor of FIG. 2, but have an electrically isolating ring in the form of isolation ring 30. When isolation ring 30 is filled with episeal 17, membrane 19 may short to base silicon layer 11. However, it may be arranged for episeal 17 to be an opposite dopant type, so that membrane 19 is junction isolated. In this exemplary embodiment, the episeal may be grown under conditions similar to those used for selective epitaxial silicon growth. Conformal epitaxial silicon growth may close vent holes 14 and simultaneously grow on top silicon layer 13 and internally on the silicon walls of cavity 15. Proper design of the epitaxial parameters may keep the silicon growth selective inside cavity 15, thus ensuring that internal electrical insulators may be kept clear of silicon, for example edge 16 of cavity 15. Oxide support ring 32A may be oxide that maintains the dielectric electrical isolation between membrane 19 and base silicon layer 11. Oxide support ring 32A may extend all the way around membrane 19 to isolate cavity 15.

Ring cavity 31 below isolation ring 30 may be etched in the same manner as cavity 15 to complete the isolation of membrane 19 from the base silicon layer 11. Ring cavity 31 may be etched in the same process step as cavity 15 by appropriate spacing of vent holes 19 accessing cavity 15 and isolation ring 30. The etch may be stopped before it etches all the oxide out to leave oxide support ring 32A. The etch may access oxide layer 12 via isolation ring 30 and etch sideways forming ring cavity 31 around the outside of cavity 15.

By constructing electrical contacts to membrane 19 and base silicon layer 11, the capacitance may therefore be measured thereby sensing the pressure. This approach offers the benefits of capacitive sensing which may often be more stable than piezoresistive sensing. Ring cavity 31 and cavity 15 may be etched in one process step by proper spacing of vent holes 14 and isolation ring 30. Alternatively, ring cavity 31 and cavity 15 may be etched in separate process steps by etching and episealing vent holes 14 before creating isolation ring 30, or vice versa. For instance, it may be possible to etch out cavity 15 without making isolation ring 30, seal vent holes 14, and then etch isolation ring 30 and leave the oxide under it. In this situation, it may only be necessary to etch isolation ring 30 to the top edge of sacrificial layer 12. The process that makes isolation ring 30 may be any etching process that is able to make steep side walls. This etching may only need to get down to ring cavity 31 to complete the isolation of membrane 19. Isolation ring 30 may be left as an air gap or alternatively may be filled with a material, for instance an oxide or oppositely doped silicon.

Figure 3B:
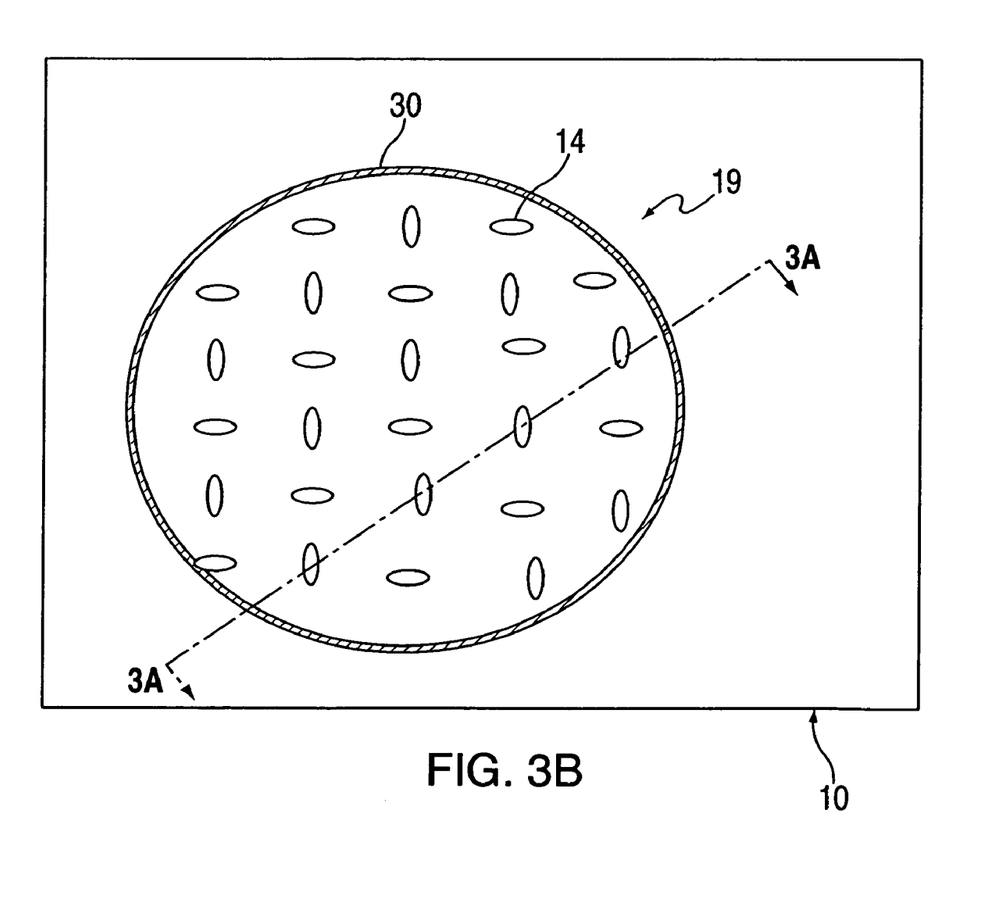
FIG. 3b is a top cross-sectional view of the exemplary embodiment shown in FIG. 3a, cut along line IIIB.

FIG. 3b shows a top side view of the pressure sensor illustrated in FIG. 3a. Vent holes 14 are illustrated as elliptical holes arranged in a basket weave pattern, though alternatively vent holes 14 may be any other shape arranged in any alternative pattern, including round holes or rounded rectangular holes. Vent holes 14 access the cavity. The outer limits of the cavity define the extent of membrane 19. Around the circumference of membrane 19 is isolation ring 30.

Figure 4A:
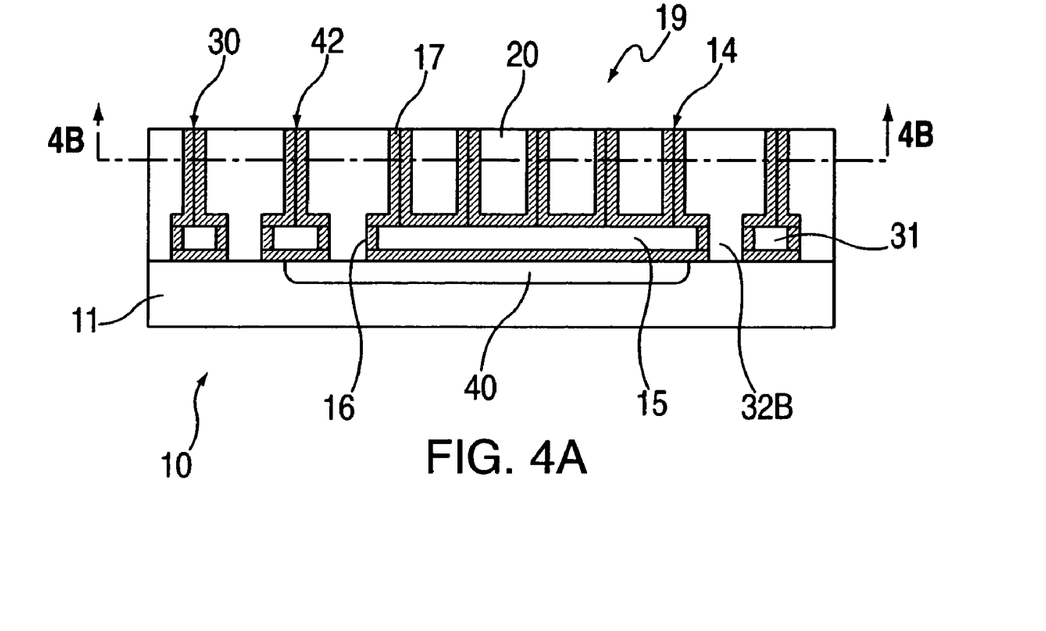
FIG. 4a is a schematic diagram showing a cross-sectional view of a pressure sensor according to an exemplary embodiment of the present invention utilizing conformal, non-selective epitaxial growth on a silicon wafer and using a capacitance sensor.

FIG. 4a shows a method of internal counter-electrode connection. FIG. 4a illustrates a junction isolated capacitive sensor built on a bulk wafer. This exemplary device may include substrate contact 41 connecting to patterned implant 40 and silicon support ring 32B acting as an isolated mechanical support. These contacts and supports may allow connecting to counter-electrodes from the front side of the wafer. Isolation rings 30 may be in single-crystal silicon and may be sealed with single crystal silicon, whereas vent holes 14 in the epipoly may be sealed with polysilicon. The episeal material can be doped opposite field silicon 43 so that p-n junctions are formed around substrate contacts 41. The encapsulation may be completed with a polishing step to remove the oppositely doped top surface. Standard electronics processing may be performed on these wafers to build post-MEMS integrated circuits. In a similar fashion to the epipoly membranes with piezoresistive sensors, the exemplary embodiment shown in FIG. 4a may require control of the interfaces between the epipoly and the single crystal silicon. Field silicon 43 may be grown in three steps. First, single-crystal silicon may be grown up to the level of the gasket oxide and over the gasket oxide until the sides over contact oxide rings (defining ring cavity 31) touch. This may be a selective deposition with lateral overgrowth. Second, non-selective poly seed may be deposited over the exposed oxide while single-crystal silicon is grown on the exposed single crystal areas. Third, epipoly and single crystal silicon may be grown up to the desired encapsulation thickness. This sequence may assure that substrate contacts 41 are covered with single-crystal silicon so that the junction isolation diodes built into the contacts have low electrical leakage.

The exemplary device of FIG. 4a has posts 32 of opposite dopant-type to the bulk substrate 11 forming the junction isolated mechanical supports. Posts of the same type as patterned implants 40 may form substrate contacts 41. Management of problems with electrostatic shielding of patterned implant 40 by the internally deposited epitaxial layer 17 may require consideration of the accumulation and depletion of the internal silicon films as a function of membrane and counter-electrode biases.

The exemplary embodiment of FIG. 4a shows a capacitive sensor 10 with two frontside contracts. The technique for fabricating sensor 10 of FIG. 4a involves growing an oppositely doped epitaxial silicon 21, 41, 43 on top of base silicon layer 11. In FIGS. 1a, 1b, 2, 3a, and 3b, the same type of silicon may be used, whereas FIG. 4a shows a method including building a p-type layer (e.g. field silicon 43) on top of an n-type layer (e.g. base silicon layer 11). An n-type silicon wafer may be utilized as base silicon layer 11 (i.e. a handle wafer). A p-type patterned implant 40 is implanted in the n-type handle wafer (base silicon layer 11). Then p-type single crystal is grown on top creating a p-type contact with the p-type implant in the form of substrate contact 41. P-type may make a junction isolation on top of n-type. Substrate contact 41 may contact patterned implant 40 while remaining electrically isolated from base silicon layer 11 and/or field silicon 43. Therefore the two contacts for measuring the capacitance between membrane 19 and the bottom of cavity 15 may be available in polycrystalline layer 20 (forming membrane 19) and substrate contact 41, respectively.

Figure 4B:
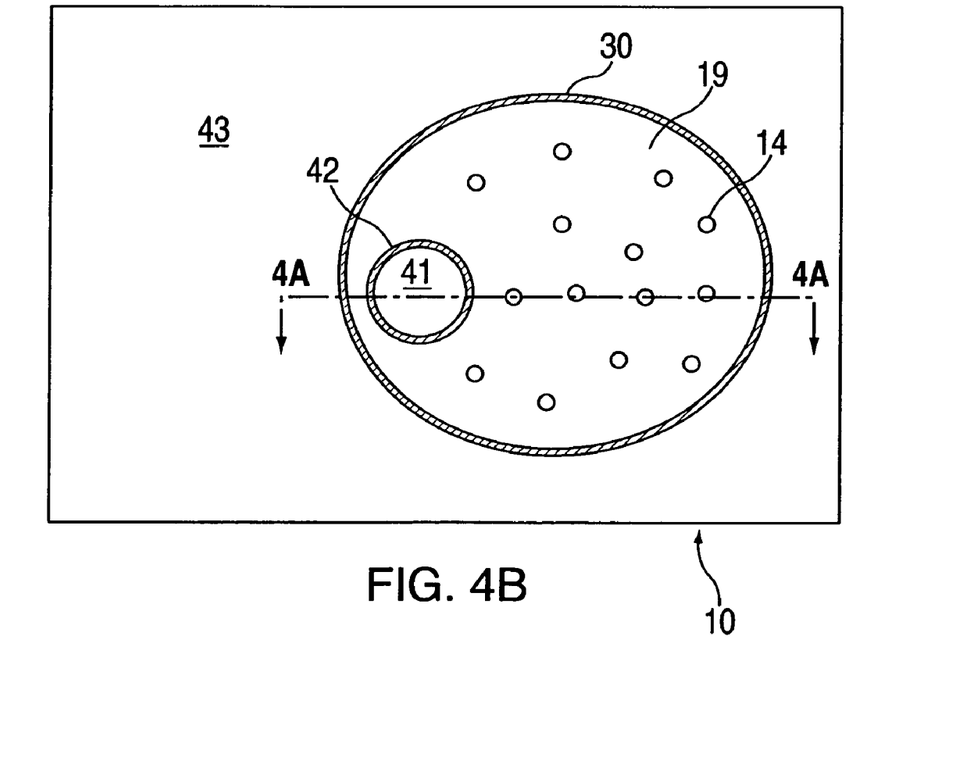
FIG. 4b is a top cross-sectional view of the exemplary embodiment shown in FIG. 4a, cut along line IVB.

FIG. 4b shows a top view of the capacitive pressure sensor 10 of FIG. 4a. Isolation ring 30, vent holes 14, and/or electrical contact isolation trench 42 is filled with epitaxially deposited silicon which may be doped opposite field silicon 43, membrane 19, and/or substrate contact 41.

An abbreviated procedure for making sensor 10 of FIGS. 4a and 4b may include the process steps: start with an n-type wafer; implant a p-type implant; deposit or grow a complete oxide layer; etch the oxide layer to make an island shape; place the product in an epitaxial reactor and build up to the top layer; polish off the top layer; etch vents through the oxide layer with an appropriate etch method; etch out all or some of the several oxide islands; seal the vents; and polish the surface. The dopant types can be reversed.

Figure 5:
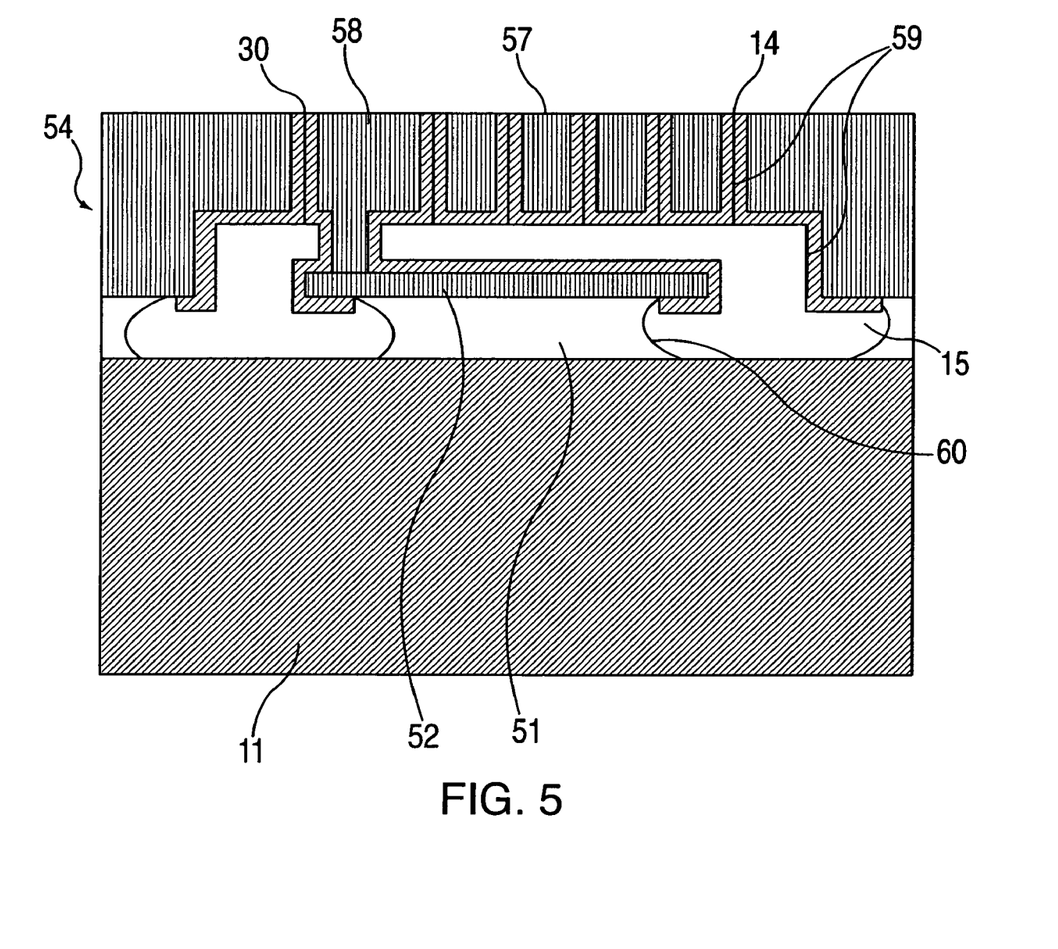
FIG. 5 shows a cross-sectional view of a pressure sensor according to an exemplary embodiment of the present invention including topside, isolated contacts for a capacitance sensor.

FIG. 5 shows a cross-sectional view of a pressure sensor according to an exemplary embodiment of the present invention including topside, isolated contacts for a capacitance sensor. The pressure sensing element of FIG. 5 may be made by the following method: first, an oxide layer is deposited on a silicon wafer, then the oxide layer is patterned, then silicon is deposited and patterned to form a bottom sensing element, then oxide is deposited and patterned, then a silicon encapsulating layer is deposited, then the silicon encapsulation layer is patterned to provide vent holes (which may be tapered or straight) and rings which isolate a top membrane, then the oxide and some of the other oxide layer is removed through the vent holes leaving at least a pillar of oxide to dielectrically isolate the silicon layer that is arranged on the bottom of the cavity, and finally, the vents are sealed with silicon. In the final sealing step, silicon is prevented from forming on the oxide pillar. In this manner, the silicon layer arranged below the cavity is dielectrically isolated from the silicon wafer and from the surrounding silicon layers. FIG. 5 shows an insulating layer 51 (which may be oxide), which has been deposited on base silicon layer 11. Insulating layer 51 may be etched and/or patterned prior to deposition of silicon sensing element layer 52. Silicon sensing element layer 52 may be etched and/or patterned prior to deposition of a second oxide layer which also may be etched and/or patterned. Silicon encapsulation layer 54 is then deposited and may be etched and/or patterned to provide vent holes 14 and/or isolation ring 30. Through vent holes 14 and/or isolation ring 30 the second oxide layer is removed by etching. Portions of insulating layer 51 may also be removed in this etching step, causing silicon sensing element layer 52 to be undercut forming pillar 60 in insulating layer 51. Then vent holes 14 and/or isolation ring 30 are sealed with silicon. An epitaxial reactor may be used to seal vent holes 14 and/or isolation ring 30, though sealing cavity 15. The step of sealing vent holes 14 and/or isolation ring 30 is adjusted to prevent silicon deposition on pillar 60, and to thereby maintain the dielectric isolation of silicon sensing element layer 52. Silicon encapsulation layer 54 forms top sensing element contact 57 and bottom sensing element contact 58.

Figure 6A:
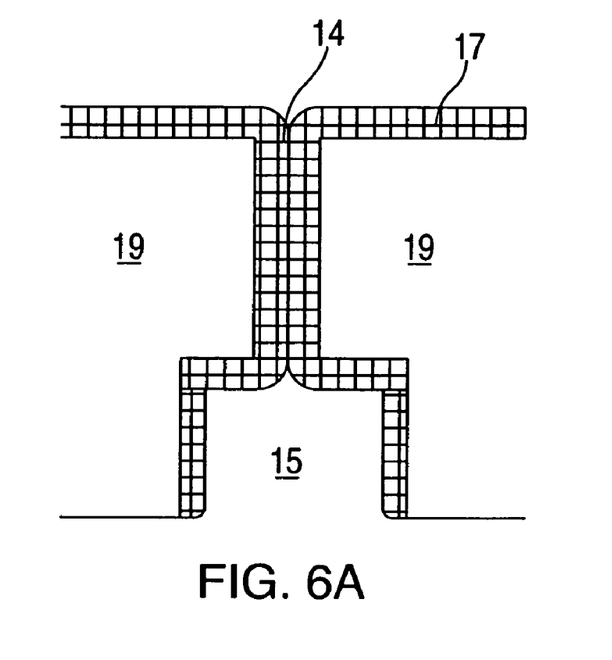
FIGS. 6a, 6b and 6c show cross-section views of schematic diagrams of vent holes of differing geometries that have been closed using conformal and non-conformal epitaxial silicon deposition.
Figure 6B:
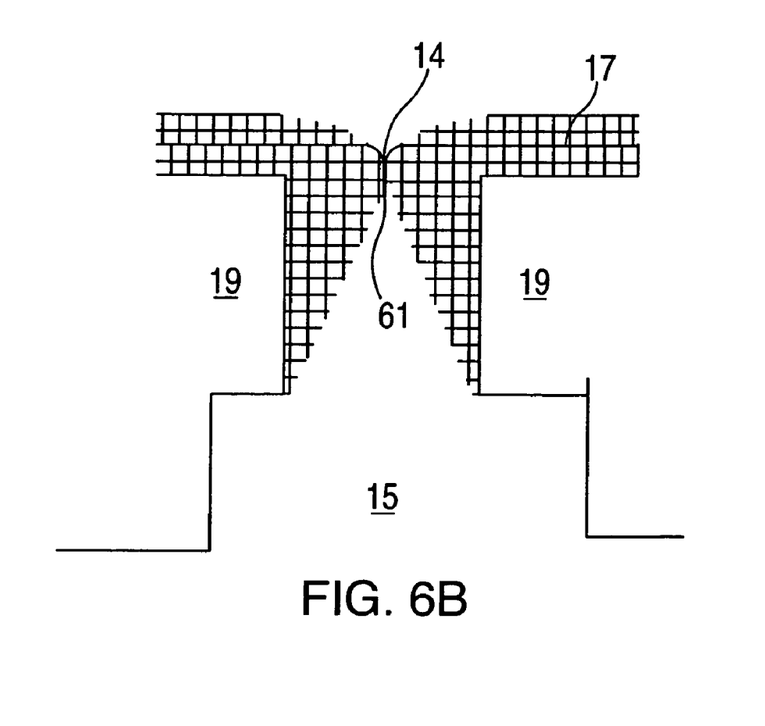
Figure 6C:
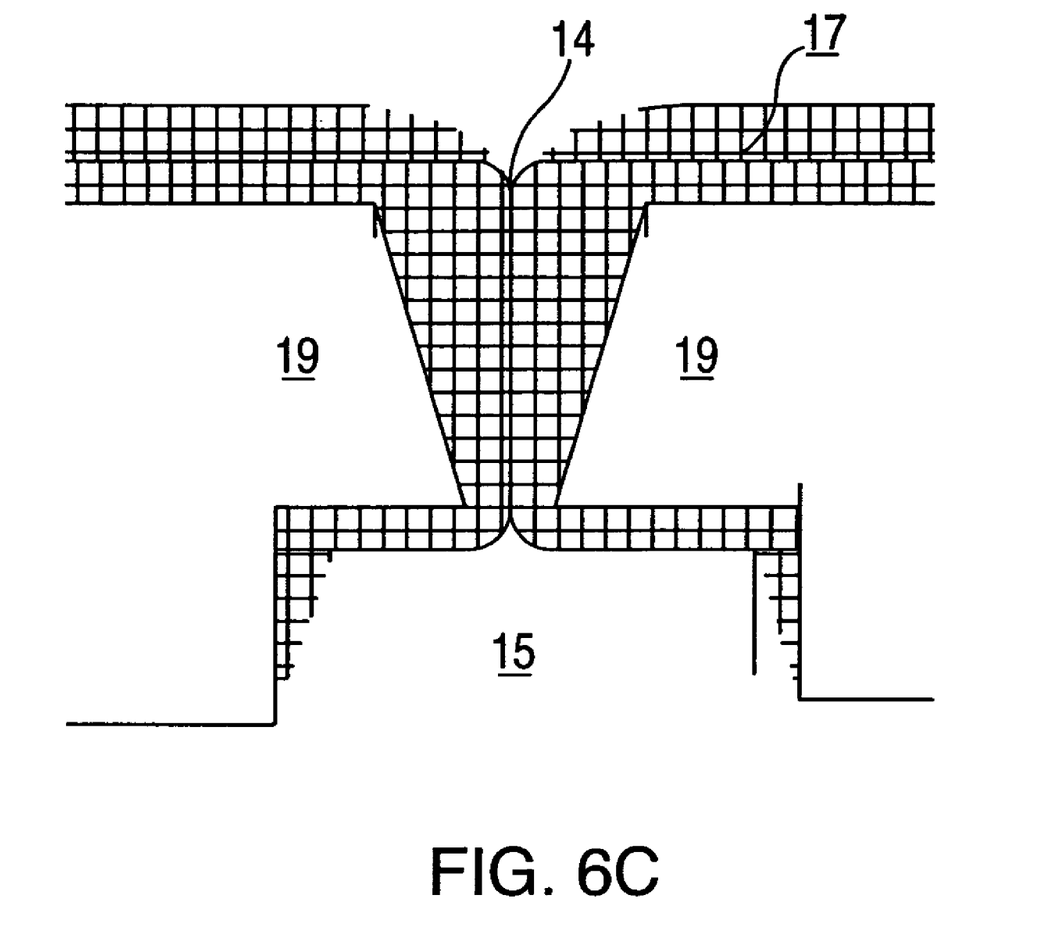

FIG. 6a shows vent hole 14 arranged in membrane 19. Vent hole 14 may be closed by a fully conformal epitaxial process causing the deposition of epitaxial layer 17, thereby causing the vent to close evenly from the bottom to the top. FIG. 6b shows vent hole 14 which may be closed by a partially conformal or non-conformal epitaxial process. In FIG. 6b, vents holes 14 arranged in membrane 19 close first near the tops, thereby halting further internal deposition of epitaxial layer 17. Notch 61 is caused by the pinching off near the top of vent hole 14 of epitaxial layer 17. Notch 61 may cause a stress concentration, thereby weakening the membrane. FIG. 6c shows vents holes 14 in membrane 19 having a tapered cross-section in which a cross-sectional width of the bottom of vent holes 14 is smaller than a cross-sectional width of the top. The smaller cross-sectional width at the bottom can close sooner than the top, allowing continued deposition of epitaxial layer 17 towards the top, outer surface of the membrane. This may allow a uniform seal and therefore a stronger and/or more predictably flexible membrane 19 by eliminating notch 61. The tapered vent holes 14 may be favored for non-conformal or partially conformal depositional processes. Alternatively, FIGS. 6a, 6b, and 6c illustrate how different epitaxial processes may be used to close trenches.

Figure 7:
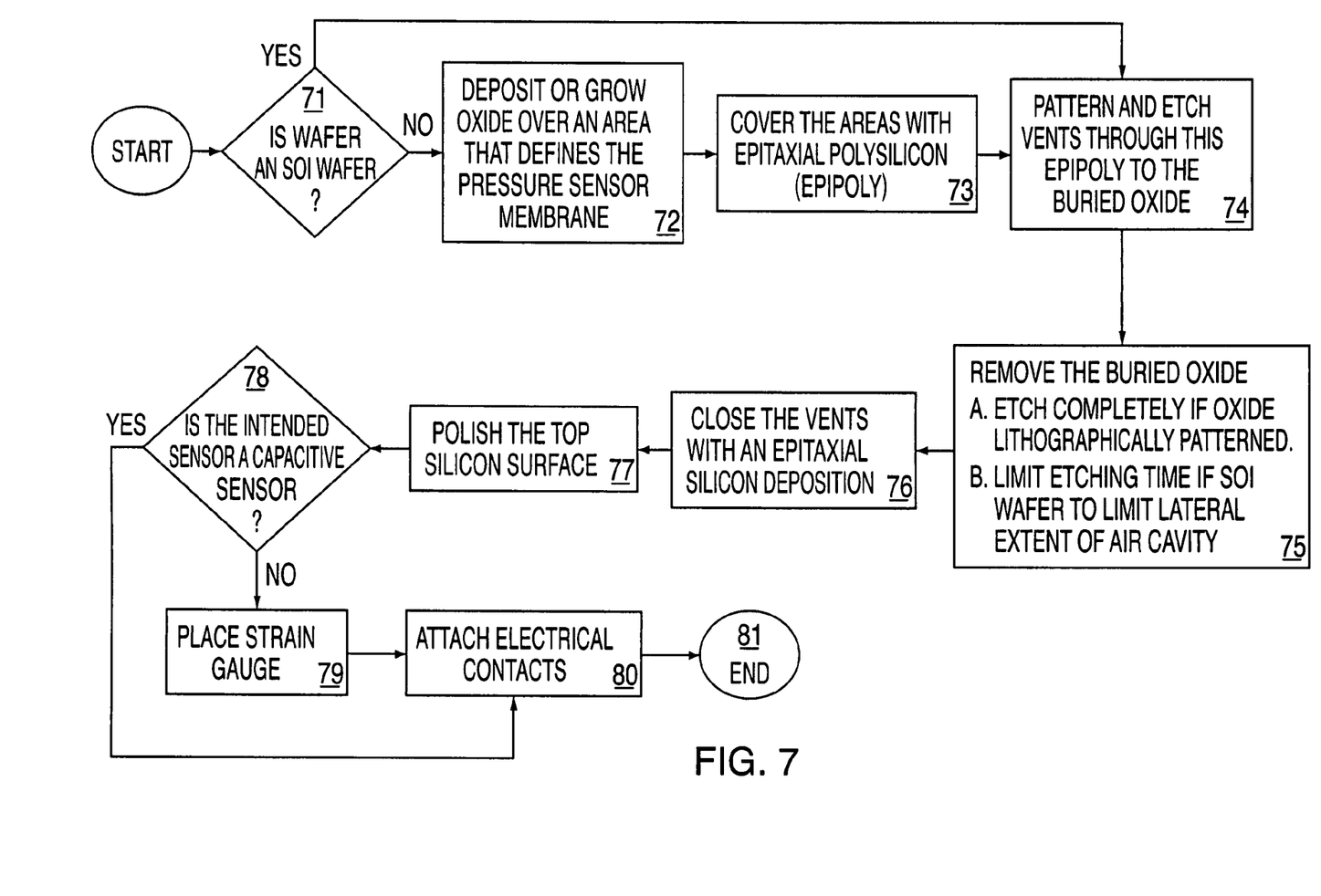
FIG. 7 is a flowchart illustrating a method according to an exemplary embodiment of the present invention for making episeal pressure sensors.

FIG. 7 is a flow chart illustrating an exemplary method according to the present invention. The flow starts in Circle 72 and proceeds to Question 71, which asks whether the wafer is an SOI wafer. If the response is negative, the flow proceeds to Action 72, which indicates to deposit or grow oxide over an area that defines the pressure sensor membrane. From Action 72, the flow proceeds to Action 73, which indicates to cover the areas with epitaxial polysilicon (epipoly). From Action 73, the flow proceeds to Action 74, which indicates to pattern and etch vents through the epipoly to the buried oxide. If the response to Question 71 is in the affirmative, the flow proceeds directly from there to Action 74. From Action 74, the flow proceeds to Action 75, which indicates to remove the buried oxide. Action 75 may typically involve an HF vapor etch. Additionally, Action 75 indicates to etch the buried oxide completely if the oxide was lithographically patterned but to limit the etching time if an SOI wafer is being used in order to limit lateral extent of the cavity. From Action 75, the flow proceeds to Action 76, which indicates to close the vents with an epitaxial silicon deposition. From Action 76, the flow proceeds to Action 77, which indicates to polish the top silicon surface. From Action 77, the flow proceeds to Question 78, which asks whether the intended sensor is a capacitive sensor. If the response is negative, then the flow proceeds to Action 79, which indicates to place a strain gauge on the membrane. As indicated above, the placement of a strain gauge may include the placement of several piezoresistors, and may involve some of the piezoresistors being positioned perpendicular to the strain while some of the piezoresistors are positioned parallel to the strain. From Action 79, the flow proceeds to Action 80, which indicates to attach electrical contacts. These electrical contacts may be to a piezoresistor or other strain gauge, to a capacitor including a backside connection, or to a capacitor with frontside contacts. If the response to Question 78 is affirmative, then the flow proceeds directly to Action 80. From Action 80, the flow proceeds to End Circle 81. In an alternative exemplary embodiment, any of the previously described substrates may be modified at any time during the production process to provide an opening from the backside to the cavity. This opening may modify the pressure sensor of the exemplary device to be a differential pressure sensor able to measure a difference in pressure from a frontside of the substrate to a backside of the substrate.

Post-mems CMOS integration may also be supported. While several embodiments have been discussed, others, within the invention's spirit and scope, are also plausible. Epitaxial sealing silicon may be replaced with CVD (Chemical Vapor Deposition) deposited silicon. Additionally, the silicon may also include varying concentrations of germanium, carbide, boron, phosphorus, or any other appropriate material, in any of the foregoing devices and/or process steps.

Variations on this procedure may yield sensors with specific advantages. For example SOI structures may have fewer fabrication steps and may offer the best quality top silicon. Alternate-doped episeal silicon may be used to form junction-isolated contacts, and buried implants may be used to form patterned counter electrodes. In some exemplary embodiments, the dopant types of the silicon may be swapped, for instance p-type to n-type and n-type to p-type.

What is claimed is:

1. A pressure sensing device, comprising:
   a substrate;
   an encapsulation layer including at least one vent, at least one void being defined between the substrate and the encapsulation layer, and extending underneath the at least one vent, a portion of the encapsulation layer above the at least one void forming a membrane;
   at least one epitaxially deposited silicon plug filling each of the at least one vent, wherein the at least one epitaxially deposited silicon plug is formed by, within the at least one vent, epitaxially growing silicon on a sidewall of the at least one vent until pinching off the at least one vent; and
   a sensing element arranged on the membrane,
   wherein each of the at least one vent has a first end and a second end, the first end being connected to the at least one void and the second end being opposite to the first end and the at least one void, and
   wherein the at least one vent tapers from the first end to the second end so that the at least one vent is wider at the second end than the first end.

2. The device according to claim 1, wherein the sensing element includes a top capacitive contact, further comprising:
   a bottom capacitive contact post arranged on the encapsulation layer, the bottom capacitive contact post electrically coupled to an implant, the implant arranged below the at least one void; and
   at least one trench etched around a circumference of the bottom capacitive contact post.

3. The device according to claim 2, wherein the at least one trench is filled with epitaxially deposited silicon doped opposite the encapsulation layer.

4. The device according to claim 2, wherein the at least one trench is filled with dielectrically insulating material.

5. The device according to claim 2, wherein the implant is doped opposite the substrate.

6. The device according to claim 2, wherein the implant is dielectrically insulated from the substrate.

7. The device according to claim 1, wherein the sensing element includes at least one strain gauge.

8. The device according to claim 7, wherein the at least one strain gauge is at least one piezoresistor.

9. The device according to claim 1, wherein the at least one void is at about vacuum.

10. The device according to claim 1, wherein the encapsulation layer includes epitaxially deposited silicon.

11. The device according to claim 10, wherein each of the at least one epitaxially deposited silicon plugs are doped opposite the epitaxially deposited encapsulation layer.

12. The device according to claim 1, wherein the device has a smooth, polished upper surface.

13. The device according to claim 12, further comprising a CMOS device arranged on the smooth, polished upper surface of the device.

14. The device according to claim 1, wherein:
   the substrate includes a passage communicating gases from a backside of the substrate to the at least one void, the passage equalizing pressure between the backside and the at least one void; and
   the sensing element measures a pressure differential between a first pressure on the frontside of the substrate and a second pressure on the backside of the substrate.

15. The device according to claim 1, wherein the portion of the encapsulation layer above the at least one void forming the membrane includes the at least one vent.

16. The device according to claim 1, wherein the portion of the encapsulation layer above the at least one void forming the membrane includes the at least one epitaxially deposited silicon plug.

17. The device according to claim 1, further comprising:
   at least one epitaxially deposited silicon layer on at least one surface of the at least one void.

18. The device claim according to claim 17, wherein the at least one epitaxially deposited silicon layer is on (a) a top surface of the at least one void adjacent at least one of the at least one epitaxially deposited silicon plug and (b) a bottom surface of the at least one void facing the top surface.

19. The device claim according to claim 18, wherein at least one epitaxially deposited silicon layer is on at least one edge surface extending between the top surface and the bottom surface.

20. The device claim according to claim 17, wherein a top surface of the encapsulation layer is smoothly polished to remove an epitaxially deposited silicon layer.

21. The device according to claim 1, wherein the pinching off the at least one vent occurs at the first end.

22. The device according to claim 1, wherein the pinching off the at least one vent occurs at the second end.

23. The device according to claim 1, wherein the opening of the at least one vent tapers from the first end to the second end in such a degree that after the first end pinches off, silicon continues epitaxial growth in the at least one vent.

24. The device according to claim 1, wherein a top surface of the encapsulation layer is free of epitaxial silicon.

25. The device according to claim 1, wherein the pinching off occurs between the first and second ends.

* * * * *